United States Patent
Paik

(10) Patent No.: US 7,390,705 B2
(45) Date of Patent: Jun. 24, 2008

(54) METHOD FOR CRYSTALLIZING AMORPHOUS SEMICONDUCTOR THIN FILM BY EPITAXIAL GROWTH USING NON-METAL SEED AND METHOD FOR FABRICATING POLY-CRYSTALLINE THIN FILM TRANSISTOR USING THE SAME

(76) Inventor: Woon Suh Paik, 577-1 I-dong, Sangnok-gu, Ansan-si, Gyeonggi-do (KR)

( * ) Notice: Subject to any disclaimer, the term of this patent is extended or adjusted under 35 U.S.C. 154(b) by 403 days.

(21) Appl. No.: 11/187,975

(22) Filed: Jul. 25, 2005

(65) Prior Publication Data

US 2006/0270129 A1    Nov. 30, 2006

(51) Int. Cl.
H01L 21/00 (2006.01)
H01L 21/20 (2006.01)
C30B 29/06 (2006.01)

(52) U.S. Cl. .................. 438/166; 438/486; 438/514; 438/489

(58) Field of Classification Search .......... 438/151, 438/166, 149, 486, 487, 795
See application file for complete search history.

(56) References Cited

U.S. PATENT DOCUMENTS

| | | | |
|---|---|---|---|
| 5,488,000 A * | 1/1996 | Zhang et al. | 438/166 |
| 6,066,547 A * | 5/2000 | Maekawa | 438/486 |
| 6,162,704 A * | 12/2000 | Yamazaki et al. | 438/471 |
| 6,558,986 B1 * | 5/2003 | Choi | 438/149 |
| 7,098,089 B2 * | 8/2006 | Paik | 438/151 |
| 7,256,080 B2 * | 8/2007 | Park et al. | 438/166 |
| 2004/0110329 A1 * | 6/2004 | Joo et al. | 438/166 |
| 2005/0142707 A1 * | 6/2005 | Kim et al. | 438/166 |
| 2007/0141767 A1 * | 6/2007 | Lee et al. | 438/166 |

\* cited by examiner

*Primary Examiner*—Walter Benson
*Assistant Examiner*—Eva Montalvo
(74) *Attorney, Agent, or Firm*—Rosenberg, Klein & Lee

(57) ABSTRACT

A method for crystallizing an amorphous semiconductor thin film using a non-metal seed epitaxial growth (NSEG) is provided. The method includes the steps of: forming a pair of non-metal seeds for inducing a crystallization of an amorphous semiconductor thin film at a predetermined distance on a transparent insulation substrate; depositing the amorphous semiconductor thin film on the insulation substrate; and heat-treating the insulation substrate to thereby epitaxially grow a poly-crystalline semiconductor thin film from the non-metal seeds, and to thus crystallize the amorphous semiconductor thin film. In the crystallization method, non-metal seeds are used instead of using crystallization induced metal to thereby epitaxially grow the poly-crystalline semiconductor thin film and to thus realize the amorphous semiconductor thin film without having metal pollution.

19 Claims, 7 Drawing Sheets

METHOD FOR CRYSTALLIZING AMORPHOUS SEMICONDUCTOR THIN FILM BY EPITAXIAL GROWTH USING NON-METAL SEED AND METHOD FOR FABRICATING POLY-CRYSTALLINE THIN FILM TRANSISTOR USING THE SAME

BACKGROUND OF THE INVENTION

1. Field of the Invention

The present invention relates to a method for crystallizing an amorphous semiconductor thin film, and a method for fabricating a poly-crystalline thin film transistor using the same, and more particularly, to a method for crystallizing an amorphous semiconductor thin film, and a method for fabricating a poly-crystalline thin film transistor using the same, in which a poly-crystalline semiconductor thin film is epitaxially grown using a non-metal seed to thereby realize a crystallization of an amorphous semiconductor thin film having no metal pollution and to thus manufacture a thin film transistor having excellent characteristics.

2. Description of the Related Art

In general, a thin film transistor which is used in a display device such as a liquid crystal display (LCD) or an organic light emitting diode (OLED) is fabricated by processes of depositing amorphous silicon on a transparent substrate such as glass or quartz, forming a gate insulation film and a gate electrode, injecting impurities into a source and a drain, and then annealing the impurities-injected source and drain to thereby activate the injected impurities.

By the way, as a display device using a thin film transistor gradually requires for a fast operating speed and becomes compact in size, a degree of integration of a driving integrated circuit (IC) becomes large and an aperture ratio of a pixel region becomes reduced. Accordingly, an electron mobility on a silicon film should be heightened so that a driving circuit is formed simultaneously together with a pixel thin film transistor (TFT), and an aperture ratio of each pixel should be heightened.

For this purpose, amorphous silicon is crystallized to form poly-crystalline silicon having a large electron mobility. Poly-crystalline silicon is largely divided into high-temperature poly-crystalline silicon obtained by processes of depositing amorphous silicon on a quartz substrate, and then heat-treating the amorphous silicon at a high temperature, and low-temperature poly-crystalline silicon obtained by processes of depositing amorphous silicon on a glass substrate, and then heat-treating the amorphous silicon at a low temperature. Here, a low-temperature poly-crystalline silicon fabrication technology is divided into an eximer laser annealing (ELA) method and a metal induced lateral crystallization (MILC) method which uses crystallization induced metal such as nickle as a catalyzer.

The eximer laser annealing (ELA) method requires for expansive equipment and crystallize silicon by a scanning process, and thus has defects in view of surface roughness and crystallization uniformity. In contrast, the MILC method can utilize conventional heat-treatment equipment and has merits of having a relatively low processing temperature and a relatively short processing time.

However, since the MILC method uses crystallization induced metal, electrical characteristics of a thin film transistor deteriorate due to metal pollution. That is, a leakage current of the thin film transistor increases and an electron mobility thereof decreases. Although various methods have been developed in order to suppress them, fundamental problems have not been solved yet.

A conventional eximer laser annealing (ELA) method of fabricating a poly-crystalline thin film transistor using a conventional method will follow.

FIGS. 1A through 1D are cross-sectional views for explaining a method of fabricating a poly-crystalline thin film transistor using an eximer laser annealing (ELA) method according to the conventional art.

Referring to FIG. 1A, a buffer layer 10 made of an oxide film is formed on an insulation substrate (not shown) such as a glass substrate, and then an amorphous silicon film 11 is formed thereon. Then, laser 12 is irradiated on the amorphous silicon film 11 by a scanning process, to thereby crystallize amorphous silicon film 11.

Thereafter, referring to FIG. 1B, the crystallized silicon film 11 is patterned by a photographic etching process, to thereby form a semiconductor layer 11a. Then, an insulation film and a metal film are sequentially deposited on the substrate, and patterned using the photographic etching process, to thereby form a gate insulation film 13 and a gate electrode 14.

Then, as shown in FIG. 1C, N-type or P-type dopant ions are injected into a source region 11S and a drain region 11D on the substrate using the gate electrode 14 as a mask. Here, a reference designation 11C denotes a channel region.

Thereafter, referring to FIG. 1D, the source region 11S and the drain region 11D are heat-treated by a scanning process in order to electrically activate the dopant ions injected thereinto.

FIGS. 2A through 2D are cross-sectional views for explaining a method of fabricating a thin film transistor using a conventional metal induced lateral crystallization (MILC) method.

Referring to FIG. 2A, a buffer layer 20 made of an oxide film is formed on an insulation substrate (not shown) such as a glass substrate. Then an amorphous silicon film of 500 Å is formed thereon and is patterned by a photographic etching process, to thereby form a semiconductor layer 21. Then, an insulation film and a metal film are sequentially deposited on the substrate, and patterned using the photographic etching process, to thereby form a gate electrode 23 and a gate insulation film 22.

Referring to FIG. 2B, N-type or P-type dopants are ion-injected on the substrate using the gate electrode 23 as a mask, to thereby form a source region 21S and a drain region 21D. As a result, a channel region 21C is defined between the source region 21S and the drain region 21D.

Referring to FIG. 2C, an off-sect structure of approximately 2 μm is formed using a photosensitive agent 24 larger than the pattern of the gate electrode 23. Crystallization induced metal 25 such an nickle (Ni) is deposited by about 50 Å in thickness on the entire surface of the photosensitive agent 24 by a sputtering method.

Thereafter, as shown in FIG. 2D, the photosensitive agent 24 is removed by a lift-off method. Accordingly, the crystallization induced metal 25 is patterned into crystallization induced metal pattern 25a so as to locally remain only in some portions of the source region 21S and the drain region 21D. Thereafter, the substrate is heat-treated using the crystallization induced metal pattern 25a at a temperature of about 580° C. under the hydrogen atmosphere, to thereby crystallize the source region 21S, the drain region 21D, and the channel region 21C, by a metal induced crystallization (MIC) method and the MILC method.

As described above, the conventional crystallization method using a conventional laser heat treatment process requires for expansive equipment and has non-uniform crystallization and inferior surface roughness. As a result, a production cost becomes high and a yield is lowered. Also, metal pollution occurring on a metal film deposited on the amorphous silicon surface for the conventional MILC method exists in the poly-crystalline silicon film, to thus deteriorate an electrical feature of a device (see IEEE Trans. Electron Devices, Vol. 40, No. 5, p. 404, 1993).

SUMMARY OF THE INVENTION

To solve the above problems, it is an object of the present invention to provide a method of crystallizing an amorphous semiconductor thin film which can manufacture a thin film transistor of excellent features by a non-metal seed epitaxial growth (NSEG) method, in which a poly-crystalline semiconductor thin film is epitaxially grown using crystallization induced non-metal seeds which are buried below the amorphous semiconductor thin film, at a low temperature of 600° C. or lower at which a glass substrate can tolerate, to thereby realize crystallization of the amorphous semiconductor thin film having no metal pollution.

It is another object of the present invention to provide a method of crystallizing an amorphous semiconductor thin film and a method of fabricating a poly-crystalline semiconductor thin film transistor using the same, in which a heat-treatment time necessary for crystallizing an amorphous semiconductor thin film can be reduced using crystallization induced non-metal seeds buried below the amorphous semiconductor thin film and crystallization induced metal formed on the upper surface of the amorphous semiconductor thin film, and a lightly doped drain (LDD) structure can be formed without having an ion-injection process by applying an off-set structure at the time of forming a pattern of the crystallization induced metal.

It is still another object of the present invention to provide a method of crystallizing an amorphous semiconductor thin film which prevents an interface characteristic from worsening between a semiconductor layer and a gate insulation film due to reduction in volume of silicon at the time of crystallizing of the amorphous silicon and can reduce a total of heat treatment time, by crystallizing the entire semiconductor layer at the time of a primary heat treatment before impurities are doped and activating the injected impurities at the time of a secondary heat treatment after the impurities have been doped, when a poly-crystalline semiconductor thin film is epitaxially grown by a non-metal seed epitaxial growth (NSEG) method.

It is yet another object of the present invention to provide a method of fabricating a low-temperature poly-crystalline thin film transistor having excellent electrical characteristics, which is fabricated using a crystallized semiconductor thin film obtained by using non-metal seeds.

To accomplish the above object of the present invention, according to a first aspect of the present invention, there is provided a method for crystallizing an amorphous semiconductor thin film, the amorphous semiconductor thin film crystallizing method comprising the steps of: forming a pair of non-metal seeds for inducing a crystallization of an amorphous semiconductor thin film at a predetermined distance on a transparent insulation substrate; depositing the amorphous semiconductor thin film on the entire surface of the insulation substrate; and heat-treating the insulation substrate to thereby epitaxially grow a poly-crystalline semiconductor thin film from the non-metal seeds, and to thus crystallize the amorphous semiconductor thin film.

Preferably, the step of forming the pair of non-metal seeds comprises the sub-steps of: depositing an amorphous silicon thin film on the insulation substrate; selectively forming a pair of island-type metal patterns at positions corresponding to the pair of non-metal seeds using the crystallization induced metal above the amorphous silicon thin film; patterning the amorphous silicon thin film using the pair of island-type metal patterns as an etching mask to thereby form a pair of amorphous silicon patterns; heat-treating the substrate to form a pair of non-metal seeds made of metal silicide; and removing the remaining metal which is not converted into the silicide in the heat-treatment step.

Also, the step of forming the pair of non-metal seeds comprises the sub-steps of: depositing an amorphous silicon thin film on the insulation substrate; depositing a crystallization induced metal film above the amorphous silicon thin film; sequentially patterning the crystallization induced metal film and the amorphous silicon thin film by photolithography using a photosensitive agent, to thereby form a pair of island-type meal patterns and amorphous silicon patterns; heat-treating the substrate to form a pair of non-metal seeds made of metal silicide; and removing the remaining metal which is not converted into the silicide in the heat-treatment step.

Further, the step of forming the pair of non-metal seeds comprises the sub-steps of: depositing a crystallization induced metal film on the insulation substrate; depositing the amorphous silicon thin film above the crystallization induced metal film; sequentially patterning the crystallization induced metal film and the amorphous silicon thin film by photolithography using a photosensitive agent, to thereby form a pair of island-type meal patterns and amorphous silicon patterns; and heat-treating the substrate to form a pair of non-metal seeds made of metal silicide.

In this case, the crystallization induced metal film is made of at least one selected from the group consisting of Ni, Pd, Ti, Ag, Au, Al, Sn, Sb, Cu, Co, Cr, Mo, Tr, Ru, Rh, Cd, and Pt, with a thickness of 1 Å to 100 Å.

Also, it is preferable that the heat-treatment for forming the metal silicide is accomplished for 30 minutes to two hours at a temperature of 400° C. to 500° C.

When the pair of non-metal seeds are formed, it is possible to form the pair of island-type metal patterns by a lift-off method using a photosensitive film, or a selective deposition method using a hard mask.

It is also possible to perform the crystallization heat-treatment before or after impurities are ion-injected in the amorphous semiconductor thin film crystallization method according to the present invention.

Prior to the heat-treatment step for crystallizing the amorphous semiconductor thin film at the time of crystallizing the amorphous semiconductor thin film, it is also possible to further comprises the steps of: patterning the poly-crystalline semiconductor thin film to thereby form a semiconductor layer which is used as an active region; sequentially forming an insulation film and a conductive metal film on the semiconductor layer; sequentially patterning the insulation film and the conductive metal film to thereby form a gate electrode and a gate insulation film; selectively ion-injecting impurities using the gate electrode as a mask to thereby define a source region and a drain region; forming an off-set formation photosensitive film pattern surrounding the gate electrode and the gate insulation film; and depositing the crystallization induced metal patterns on the entire surface of the substrate, and then removing the photosensitive film pattern by a lift-off method, to thereby locally cover only some portions of the source region and the drain region with the pair of crystallization induced metal pattern isolated by an off-set distance from the gate insulation film.

According to the present invention, a thin film transistor can be manufactured using the amorphous semiconductor thin film crystallization method. In this case, the thin film transistor manufacturing method comprising the steps of: forming a pair of non-metal seeds for inducing a crystallization of an amorphous semiconductor thin film at a predetermined distance on a transparent insulation substrate; depositing and patterning the amorphous semiconductor thin film on the entire surface of the insulation substrate, to thereby form a semiconductor layer; sequentially depositing and patterning an insulation film and a metal film on the substrate to thereby form a gate electrode and a gate insulation film; ion-injecting dopants using the gate electrode as a mask to thereby define a source region and a drain region; and heat-treating the insulation substrate to thereby epitaxially grow a poly-crystalline semiconductor thin film from the non-metal seeds, and to thus crystallize the amorphous semiconductor thin film.

According to another aspect of the present invention, the thin film transistor manufacturing method comprising the steps of: forming a pair of non-metal seeds for inducing a crystallization of an amorphous semiconductor thin film at a predetermined distance on a transparent insulation substrate; depositing and patterning the amorphous semiconductor thin film on the entire surface of the insulation substrate, to thereby form a semiconductor layer; heat-treating the insulation substrate to thereby epitaxially grow a poly-crystalline semiconductor thin film from the non-metal seeds, and to thus crystallize the amorphous semiconductor thin film; sequentially depositing and patterning an insulation film and a metal film on the substrate to thereby form a gate electrode and a gate insulation film; and ion-injecting dopants using the gate electrode as a mask to thereby define a source region and a drain region.

As described above, in the case that the amorphous silicon is crystallized at a low temperature by a non-metal seed epitaxial growth (NSEG) method according to the present invention, silicide is formed before crystallization heat-treatment is performed, and the remaining metal is removed, to thereby remove the source of metal pollution in the silicon and thus improve characteristics of a semiconductor device.

BRIEF DESCRIPTION OF THE DRAWINGS

The above and other objects and advantages of the present invention will become more apparent by describing the preferred embodiments thereof in detail with reference to the accompanying drawings in which.

DETAILED DESCRIPTION OF THE INVENTION

Preferred embodiments of the present invention will be described with reference to the accompanying drawings.

FIGS. 3A through 3G are cross-sectional views for explaining a method of fabricating a P-type thin film transistor according to a first preferred embodiment of the present invention.

Figure 1A:
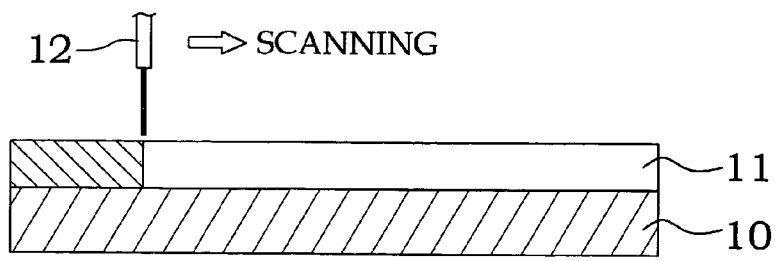
FIGS. 1A through 1D are cross-sectional views for explaining a method of fabricating a poly-crystalline thin film transistor using an eximer laser annealing (ELA) method having no metal pollution according to the conventional art.
Figure 1B:
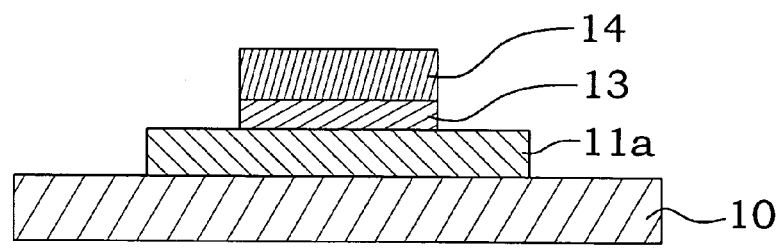
Figure 1C:
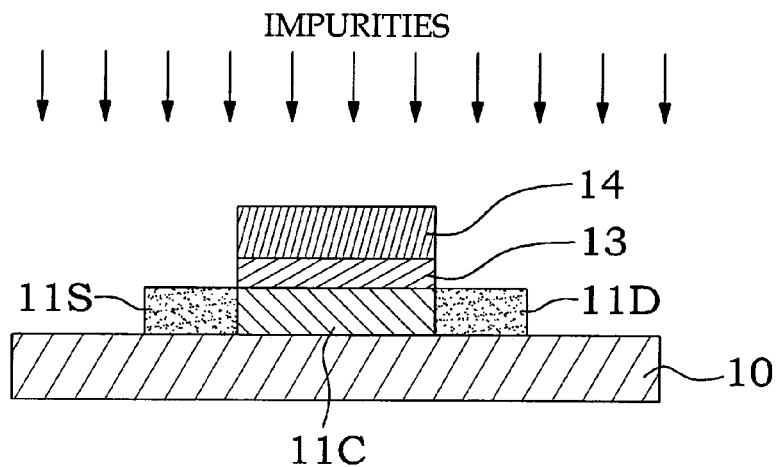
Figure 1D:
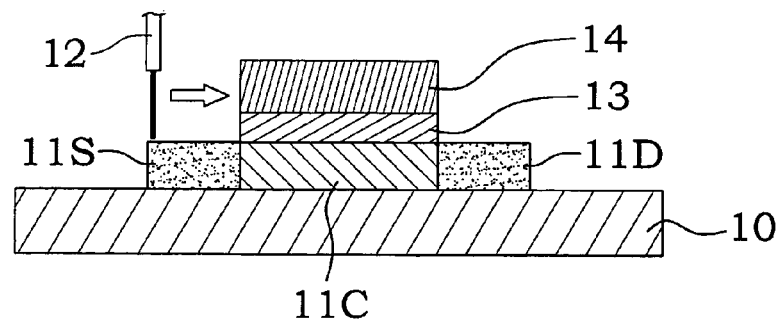
Figure 2A:
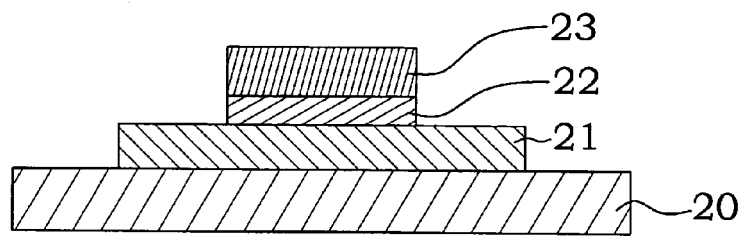
FIGS. 2A through 2D are cross-sectional views for explaining a method of fabricating a thin film transistor using a metal induced lateral crystallization (MILC) method according to the other conventional art.
Figure 2B:
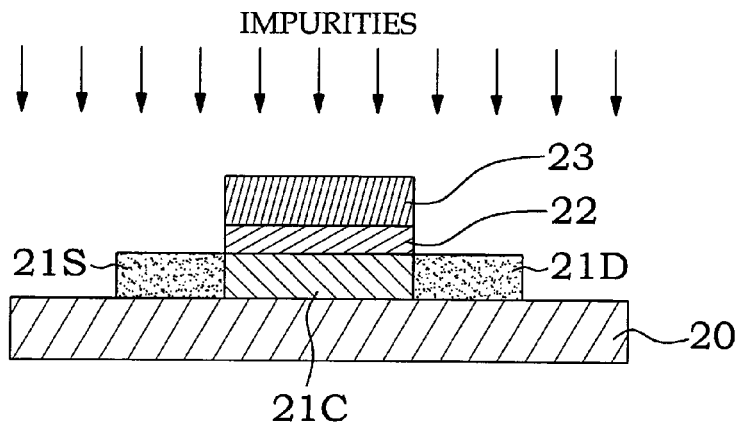
Figure 2C:
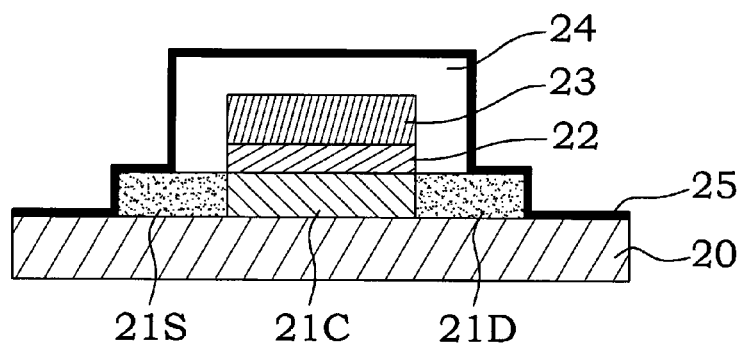
Figure 2D:
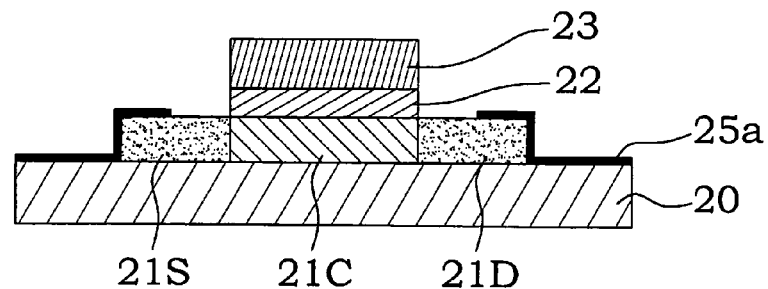
Figure 3A:
FIGS. 3A through 3G are cross-sectional views for explaining a method of fabricating a P-type thin film transistor according to a first preferred embodiment of the present invention.

Referring to FIG. 3A, a buffer layer 30 made of an oxide film is formed on an insulation substrate (not shown) such as a glass substrate, and then an amorphous silicon thin film 31 is formed thereon as an amorphous semiconductor thin film, for example, by using a low-pressure chemical vapor deposition (LPCVD) method, with a thickness of about 100 Å to 400 Å.

Figure 3B:
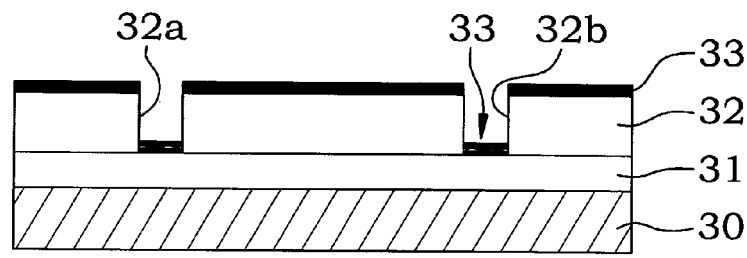

Then, as shown in FIG. 3B, a photosensitive agent is deposited on the entire surface of the amorphous silicon thin film 31, to thereby form a photosensitive film 32, and a pair of contact holes 32a and 32b of, for example, size of 4 μm×4 μm, at a position distance by, for example, about 7 μm, from a gate region to be defined later, using a contact mask (not shown) which is used to form contact holes with respect to source and drain regions in the post-processes.

A crystallization induced metal film 33 is deposited with a thickness of 1~100 Å, on the entire surface of the photosensitive film 32 including the pair of contact holes 32a and 32b by a sputtering method or ion-injection method. As a result, the crystallization induced metal film 33 contacts partially the amorphous silicon thin film 31 through the contact holes 32a and 32b.

Here, the applicable material of the crystallization induced metal film 33 is the same as that of a metal induced lateral crystallization (MILC) method, which can be any one selected from the group consisting of Ni, Pd, Ti, Ag, Au, Al, Sn, Sb, Cu, Co, Cr, Mo, Tr, Ru, Rh, Cd, and Pt.

Figure 3C:
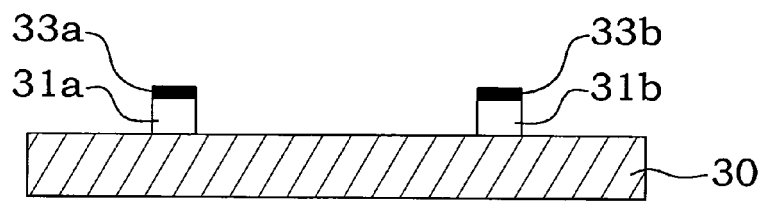

Then, if the photosensitive film 32 is removed from the insulation substrate 30 by a lift-off method, only a pair of island-type metal patterns 33a and 33b remain as shown in FIG. 3C, and the other crystallization induced metal films 33 are removed, to thereby have the upper surface of the amorphous silicon thin film on the substrate exposed.

In this case, the contact mask which is essentially used for fabricating a thin film transistor (TFT) has been used in order to form the pair of island-type metal patterns 33a and 33b in the first embodiment. However, it is possible to form island-type metal patterns having patterns and formatting positions differing from the other embodiments in which a pair of island-type metal patterns 33a and 33b are directly deposited on an amorphous silicon thin film 31 using a separate hard mask on which holes corresponding to the pair of island-type metal patterns 33a and 33b are formed.

Also, it is also possible to form a pair of island-type metal patterns 33a and 33b in which a desired patterned photoresist pattern is formed on the crystallization induced metal film 32 according to a well-known patterning method, and the photoresist pattern is used as a mask.

Then, the amorphous silicon thin film 31 is dry-etched or wet-etched, using the island-type metal patterns 33a and 33b as an etching mask, to thereby form a pair of island-type amorphous silicon patterns 31a and 31b.

Thereafter, the substrate is heat-treated for thirty minutes to two hours, for example, for thirty minutes at a temperature of 400° C. to 600° C. Then, the island-type metal patterns 33a and 33b and the island amorphous silicon patterns 31a and 31b react with each other, to thereby form metal silicide.

Figure 3D:
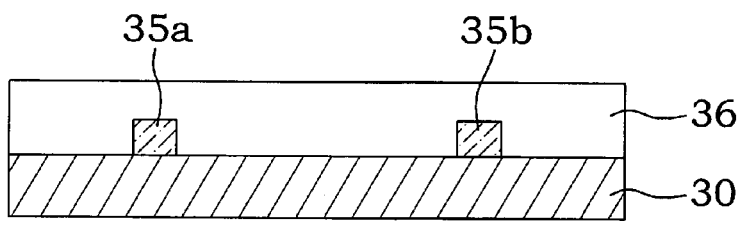

Referring to FIG. 3D, when some metal patterns react with silicon, they are not converted into silicide at the heat-treatment time. Accordingly, the remaining metal patterns 33a and 33b are removed by the wet etching, to thereby form a pair of non-metal seeds 35a and 35b made of metal silicide to be used for epitaxial growth of amorphous silicon. An amorphous silicon thin film 36 is again deposited and patterned on the substrate including the seeds 35a and 35b by a low-pressure chemical vapor deposition (LPCVD) method with a thickness of about 500 Å to 1000 Å, to thereby form a semiconductor layer 36a to be used as an active region.

Figure 3E:
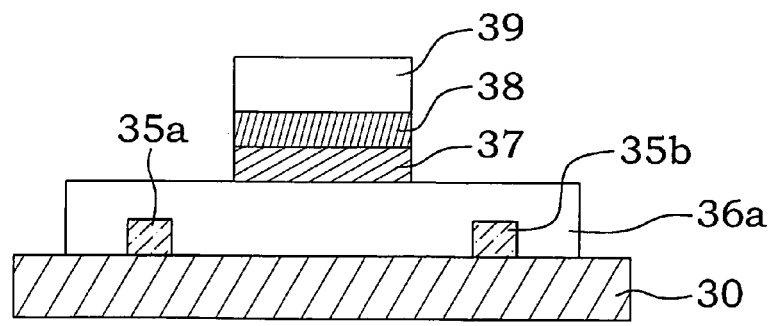

Referring to FIG. 3E, an insulation film and a metal film are sequentially deposited on the substrate including the semiconductor layer 36a, and etched using a gate formation photosensitive film pattern 39 as a mask, to thereby form a gate electrode 38 and a gate insulation film 37.

Figure 3F:
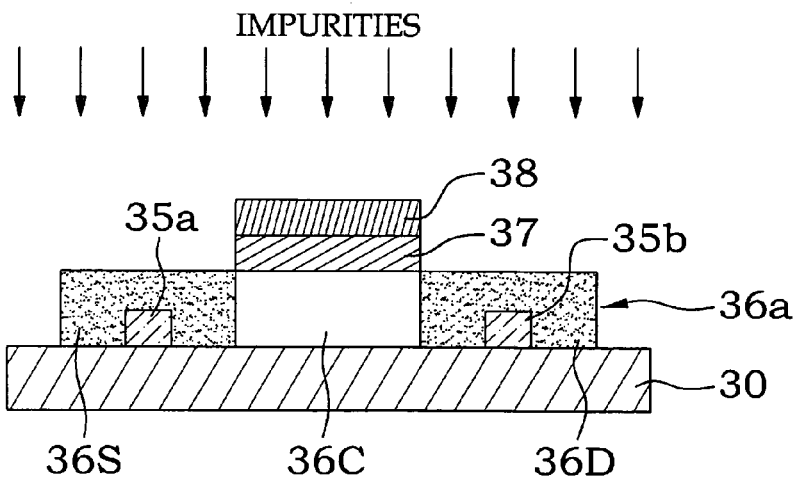

Then, as shown in FIG. 3F, N-type or P-type dopant ions are injected into the substrate, to thereby define a source region 36S and a drain region 36D. In this case, for example, P, $NH_3$ or As (in case of an N-type) or B, $B_2H_6$ or $BH_3$ (in case of a P-type) is ion-injected as the injected dopant. As a result, a region where no dopant is injected between the source region 36S and the drain region 36D, becomes a channel region 36C.

Figure 3G:
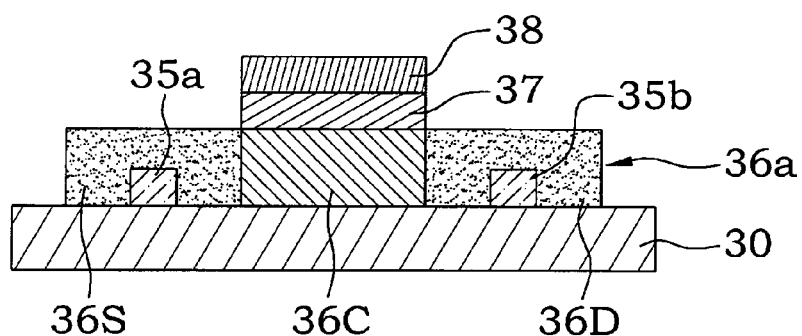

Referring to FIG. 3G, the substrate having the above-described structure is heat-treated for one hour to five hours, at a temperature of 400 to 600° C., for example, at a temperature of 580° C., under a hydrogen atmosphere. Accordingly, silicide is spread from the pair of non-metal seeds 35a and 35b made of the silicide to the amorphous silicon region, to thereby crystallize the amorphous silicon and simultaneously epitaxially grow a poly-crystalline silicon thin film. That is, crystalline silicon is formed in regions where silicide is passed.

A heat-treatment for epitaxially growing a poly-crystalline silicon thin film from the non-metal seeds 35a and 35b is preferably accomplished in a tubular furnace, and can be performed using a lamp rapid thermal annealing (RTA) or a laser thermal apparatus. In this case, a heat-treatment for epitaxially growing the poly-crystalline silicon thin film is executed after the gate insulation film and the gate electrode are formed and then dopants are injected as in the first embodiment. Otherwise, it is possible to perform a heat-treatment at first, and then form the gate insulation film and the gate electrode to then inject the dopants, as in a third embodiment to be described later. That is, a heat-treatment for epitaxial growth according to the present invention can be executed at any step after forming amorphous silicon on the non-metal seeds.

Thus, in the case of the first embodiment of the present invention, since the pair of non-metal seeds 35a and 35b exist on the bottom of the semiconductor layer 36a which is used as an active region, and an operating region of a thin film transistor (TFT) is limited on the surface of the semiconductor layer 36a, an influence with respect to a silicon-oxide film interface is reduced due to crystallization induced metal at the time of a MILC crystallization. In particular, since silicide is formed before a crystallization heat-treatment is accomplished in the case of the present invention and then the remaining metal is removed, metal pollution in the silicon is removed to thereby enhance the characteristics of a semiconductor device.

That is, in the case of a MILC crystallization, since crystallization induced metal is directly deposited on amorphous silicon in an active layer and then heat-treated, a region just below the region where induced metal is deposited is crystallized by a MIC method which crystallizes silicon in which silicide made on the upper surface advances to the lower portion. A portion where induce metal is not deposited is crystallized by a MILC method which crystallizes silicon in which the silicide is spread laterally.

In the MILC crystallization, induced metal which remains without having been changed into silicide can be included in a MIC region and a MILC region. If induced metal is included in the MIC region and the MILC region, the characteristics of the TFT deteriorate. For example, a leakage current of the TFT can be increased. In particular, since crystallization induced metal is deposited on the upper portion of source and drain regions near a silicon-oxide film interface which greatly influences the characteristics of a transistor, the remaining induced metal is not desirable in view of the TFT characteristics.

In the present invention, silicide is spread from the non-metal seeds 35a and 35b to the amorphous silicon regions to thus crystallize amorphous silicon. In this case, epitaxial growth is accomplished. In particular, a concept of an epitaxial growth in the present invention means that amorphous silicon is crystallized along a texture of seeds differing from a single-crystal on an existing single-crystal substrate. That is, while silicide advances in various directions from seeds, amorphous silicon is crystallized to then be grown to poly-crystalline silicon. However, as far as silicon is crystallized by silicide advancing in a certain particular direction, the silicon has a texture of an identical crystalline azimuth, which can be referred to as an epitaxial growth.

Thereafter, in order to improve electrical features of a thin film transistor, a particular heat-treatment is executed using a tubular furnace, a lamp rapid thermal annealing (RTA) or a laser thermal processing apparatus, in order to activate the dopants in the source and drain regions 36S and 36D. Since heat-treatment for activating the dopants enables crystallization of amorphous silicon and simultaneously activation thereof in the case that the dopants are injected before the source and drain regions 36S and 36D are crystallized as in the case of the first embodiment. Accordingly, there is no need to perform an additional heat-treatment actually.

Thereafter, an interlayer insulation film is formed on the substrate according to the well-known process, and contact plugs and connection wires with respect to the source, drain and gate are formed using the contact mask, to thereby complete a thin film transistor.

Meanwhile, a primary heat-treatment between amorphous silicon thin film and crystallization induced metal for forming silicide and a secondary heat-treatment for epitaxial growth are substantially same in the temperature range. However, since only silicon having a thin thickness of 100 Å to 400 Å at the lower portion of a metal layer is made into silicide through the heat-treatment for forming silicide, the heat-treatment is preferably executed for a short time at a further low temperature.

Figure 4:
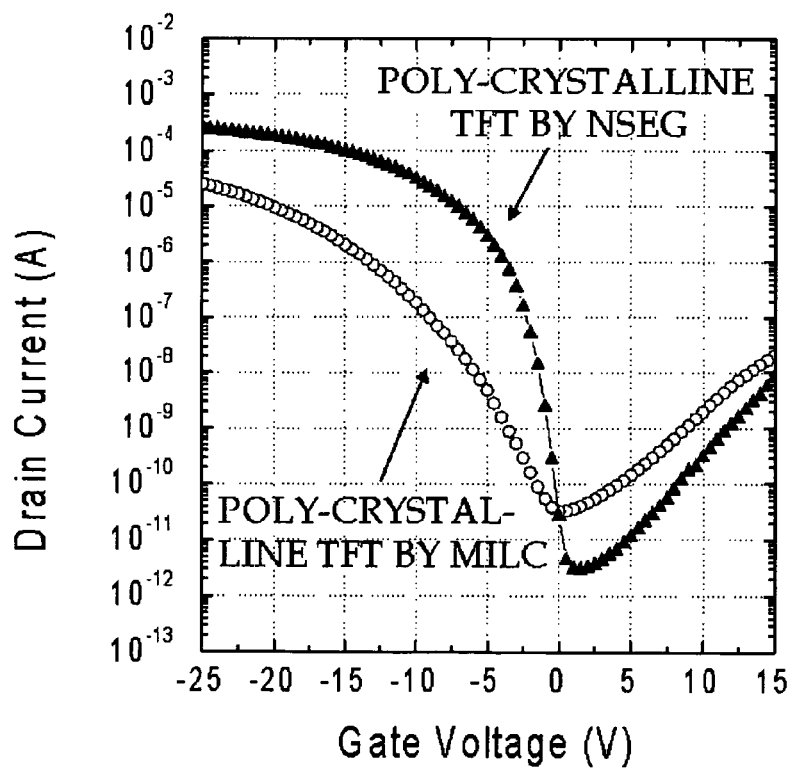
FIG. 4 is a graph illustrating transfer characteristics of a poly-crystalline thin film transistor fabricated by the conventional metal induced lateral crystallization (MILC) method and a poly-crystalline thin film transistor fabricated by the first embodiment of the present invention.

FIG. 4 is a graph showing a characteristic of a gate voltage versus a drain current in a P-type poly-crystalline thin film transistor fabricated according to the first embodiment of the present invention. In the case that a drain voltage is 10V, an on-current is $9.4 \times 10^{-6}$ A at a gate voltage of −20V for a thin film transistor fabricated by the conventional MILC method, and an off-current is $1.3 \times 10^{-10}$ A at a gate voltage of 5V. Meanwhile, if a non-metal seed epitaxial growth (NSEG) method according to the present invention is applied, an on-current is increased into $1.7 \times 10^{-4}$ A and an off-current is decreased into $1.4 \times 10^{-11}$ A. Also, in the case of the conventional MILC method, an electron mobility is fifteen (15), while a thin film transistor fabricated by a NSEG method has a high electron mobility of about sixty-four (64).

This means that metal pollution which causes a leakage current is greatly reduced in the case that the NSEG method is applied. Also, since seeds for crystallization exist in the lower portion of amorphous silicon, the crystalline defects occurring in the seeds are not formed on the silicon surface which is an operating region of a transistor, which contributes for reduction in leakage current.

FIGS. 5A through 5D are cross-sectional views for explaining a method of fabricating an N-type thin film transistor according to a second preferred embodiment of the present invention.

In general, in the case that N-type dopants are injected, it has been reported that a lateral crystallization speed of an amorphous silicon thin film is reduced due to metal silicide (J. App. Phys. Vol. 91, No. 3, P 1236). Thus, since a lateral crystallization speed of an amorphous silicon thin film is low, an off-set shaped metal film which is same as that of the conventional MILC method is deposited on the upper portion of the amorphous silicon after forming a gate electrode, to thereby shorten a time taken for crystallization.

Figure 5A:
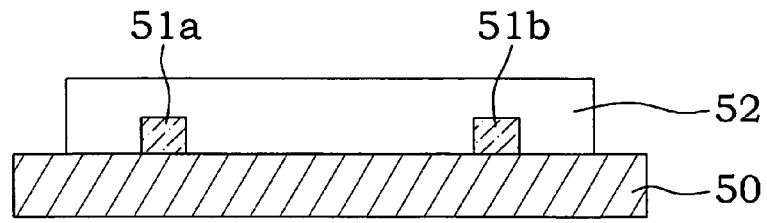
FIGS. 5A through 5D are cross-sectional views for explaining a method of fabricating an N-type thin film transistor according to a second preferred embodiment of the present invention.

Referring to FIG. 5A, non-metal seeds 51a and 51b are formed on a buffer layer 50 as shown in FIG. 3D according to the first embodiment of the present invention. Then amorphous silicon of 500 Å to 1000 Å is formed on the entire surface of the substrate using a low pressure chemical vapor deposition (LPCVD) method and is patterned, to thereby form a semiconductor layer 52 as an active region.

Figure 5B:
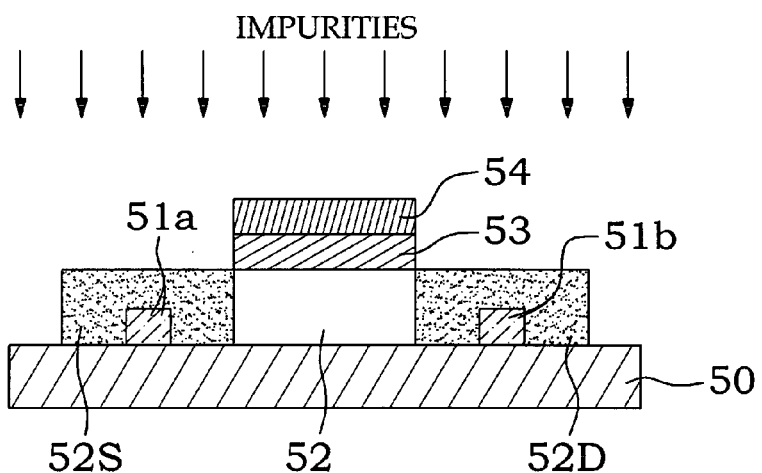

Referring to FIG. 5B, an insulation film and a metal film are sequentially deposited and patterned on the substrate, to thereby form a gate electrode 54 and a gate insulation film 53. N-type dopants such as phosphorous (P) or arsenic (As) are ion-injected on a source region 52S and a drain region 52D using the gate electrode 54 as a mask.

Figure 5C:
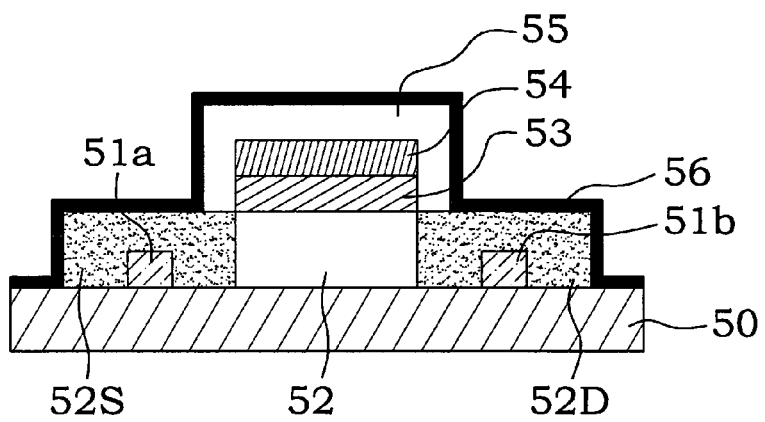

Referring to FIG. 5C, an off-set forming photosensitive film pattern 55 is formed on the substrate. Crystallization induced metal 56 is deposited by about 1 Å to 100 Å in thickness on the entire surface of the substrate by a sputtering method or an ion injection method. Thereafter, the photosensitive film is removed by a lift-off method. Accordingly, a pair of crystallization induced metal patterns 56a and 56b are formed at an off-set distance from the gate insulation film 53, so as to locally cover some portions of the source region 52S and the drain region 52D.

Figure 5D:
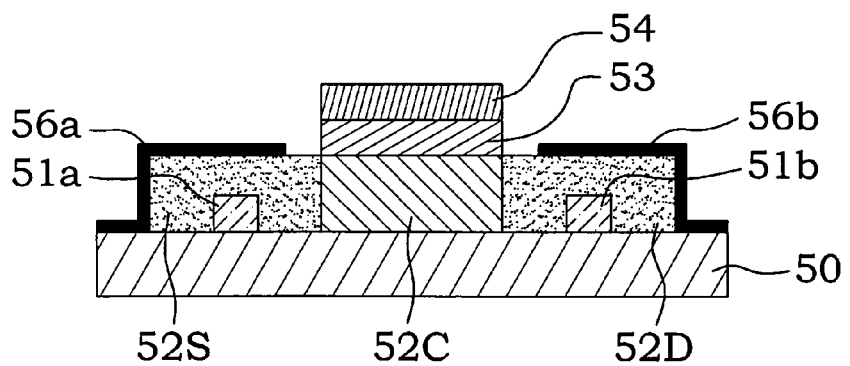

Referring to FIG. 5D, the substrate is heat-treated at a temperature of 400° C. to 600° C. under the hydrogen atmosphere, to thereby crystallize the source region 52S, the drain region 52D, and the channel region 52C which are used as active regions.

Figure 6:
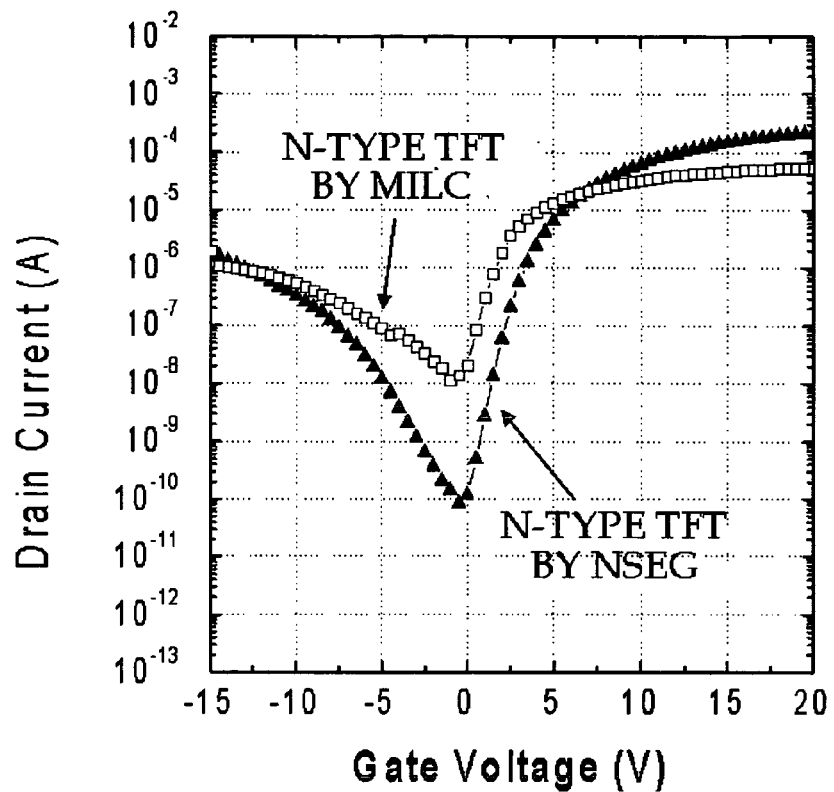
FIG. 6 is a graph illustrating transfer characteristics of an N-type poly-crystalline thin film transistor fabricated by the conventional metal induced lateral crystallization (MILC) method and an N-type poly-crystalline thin film transistor fabricated by the second embodiment of the present invention.

FIG. 6 is a graph illustrating transfer characteristics of an N-type poly-crystalline thin film transistor fabricated by the conventional metal induced lateral crystallization (MILC) method and an N-type poly-crystalline thin film transistor fabricated by the second embodiment of the present invention.

In the case that a drain voltage is 10V as shown in FIG. 6, an on-current is $5.2 \times 10^{-5}$ A at a gate voltage of 20V for a thin film transistor fabricated by the conventional MILC method, and an off-current is $8.7 \times 10^{-8}$ A at a gate voltage of −5V. Meanwhile, if a non-metal seed epitaxial growth (NSEG) method according to the second embodiment of the present invention is applied, an on-current is increased into $2.1 \times 10^{-4}$ A and an off-current is decreased into $1.2 \times 10^{-8}$ A. Also, in the case of the conventional MILC method, an electron mobility is eleven (11), while a thin film transistor fabricated by a NSEG method has a high electron mobility of about forty-seven (47).

This means that the N-type thin film transistor exerts deteriorated electrical characteristics in comparison with a P-type thin film transistor fabricated using the NSEG method according to the first embodiment of the present invention, but exerts more excellent electrical characteristics than those of the N-type thin film transistor fabricated by the conventional MILC method.

Meanwhile, assuming that a distance between a pair of non-metal seeds and a gate insulation film, that is, a distance between respective source/drain contacts is set 20 μm, when only the NSEG method is performed according to the first embodiment of the present invention, a crystallization time is five hours in the case of an N-type TFT, and three hours in the case of a P-type TFT. In the case that a composite process of NSEG+MILC is performed according to the second embodiment of the present invention, a crystallization time for an N-type TFT is three hours in a TFT of an identical dimension.

If this is calculated in terms of a growth length per one hour, an N-type NSEG is expressed as 4 μm/hr, an N-type NSEG+MILC is expressed as 6.6 μm/hr, and a P-type NSEG is expresses as 6.6 μm/hr.

Thus, since the case that N-type dopants are injected consumes substantially double the crystallization time in comparison with the case that P-type dopants are injected, fast crystallization can be accomplished in the case that crystallization is performed with a composite process of NSEG+MILC as in the second embodiment of the present invention.

Meanwhile, in the case that the P-type dopants are injected, a crystallization speed is enhanced more than two times in comparison with the case that the N-type dopants are injected (IEEE Trans. Electron Devices, Vol. 50, No. 12, p. 23-44). Thus, fast crystallization can be accomplished using only non-metal seeds with the same method as that of the first embodiment, without depositing additional metal by a MILC method.

When both NSEG and MILC are used simultaneously as in the case of the second embodiment of the present invention, a crystallization speed is enhanced. The reason is presumably because crystallization is simultaneously performed at both the upper and lower portions of amorphous silicon. In this case, if the MILC crystallization induced metal is introduced onto the upper portion of the amorphous silicon, the characteristics of TFTs is slightly lowered, but exerts an excellent features in comparison with an N-type transistor fabricated by only the MILC method as illustrated in the graph of FIG. 6.

Meanwhile, in the case of the crystallization method using the NSEG according to the present invention, it is possible to change a process so that an amorphous silicon thin film is crystallized in advance using seeds, and then all the post-processes such as formation of a gate insulation film and a gate metal film are performed. The case that an amorphous silicon film is crystallized in advance has a merit that prevents a silicon-oxide film interface characteristic from worsening due to reduction in volume of silicon at the time of crystallizing the amorphous silicon after forming the gate insulation film and the gate electrode. This will be described according to the following third embodiment of the present invention.

FIGS. 7A through 7E are cross-sectional views for explaining a method of fabricating an N-type thin film transistor according to a third preferred embodiment of the present invention.

Figure 7A:
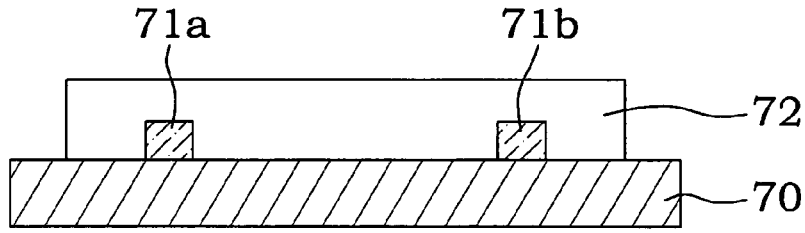
FIGS. 7A through 7E are cross-sectional views for explaining a method of fabricating an N-type thin film transistor according to a third preferred embodiment of the present invention.

Referring to FIG. 7A, non-metal seeds 71a and 71b are formed on a buffer layer 70 as shown in FIG. 3D according to the first embodiment of the present invention. Then amorphous silicon thin film of about 500 Å to 1000 Å is formed on the entire surface of the substrate including the seeds 71a and 71b using a low pressure chemical vapor deposition (LPCVD) method and is patterned in the form of an island, to thereby form a semiconductor layer 72 as an active region.

Figure 7B:
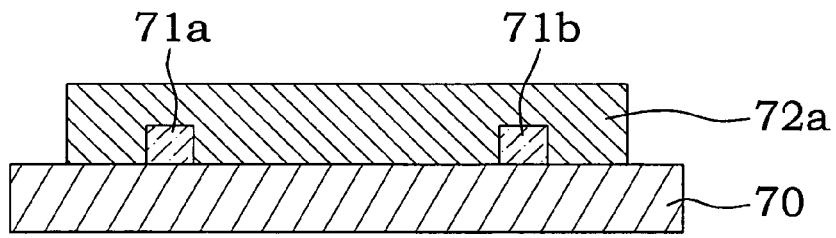

Referring to FIG. 7B, the substrate having the above-described structure is heat-treated for one hour to five hours, at a temperature of 400 to 600° C., for example, at a temperature of 580° C., under a hydrogen atmosphere. Accordingly, silicide is spread from the pair of non-metal seeds 71a and 71b made of the silicide to the amorphous silicon region, to thereby crystallize the amorphous silicon on the entire semiconductor layer 72. That is, crystalline silicon is formed in regions where silicide is passed.

Figure 7C:
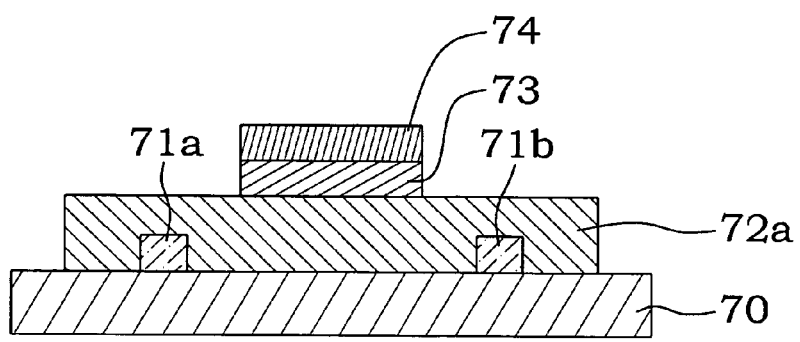

Thereafter, referring to FIG. 7C, an insulation film and a metal film are sequentially deposited on the substrate including the semiconductor layer 72, and etched using a gate formation photosensitive film pattern as a mask, to thereby form a gate electrode 74 and a gate insulation film 73.

Figure 7D:
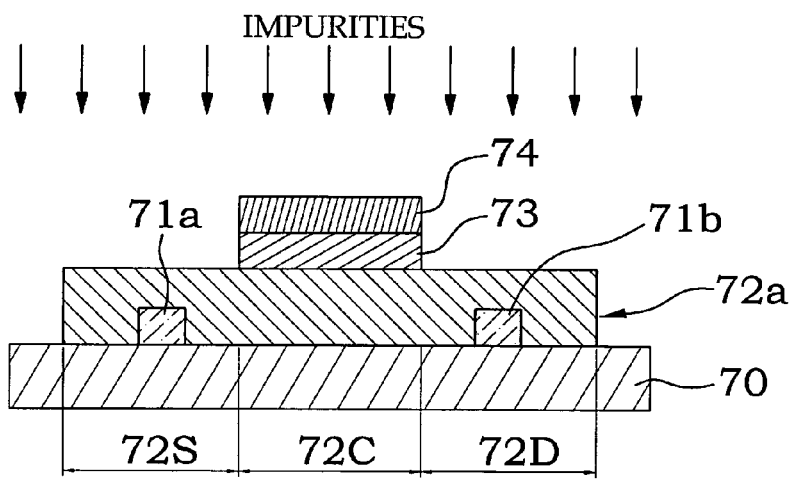

Then, as shown in FIG. 7D, N-type or P-type dopant ions are injected into the substrate, using the gate electrode 74 as a mask, to thereby define a source region 72S and a drain region 72D. In this case, for example, P, $NH_3$ or As (in case of an N-type) or B, $B_2H_6$ or $BH_3$ (in case of a P-type) is ion-injected as the injected dopant. As a result, a region where no dopant is injected between the source region 72S and the drain region 72D, becomes a channel region 72C.

Figure 7E:
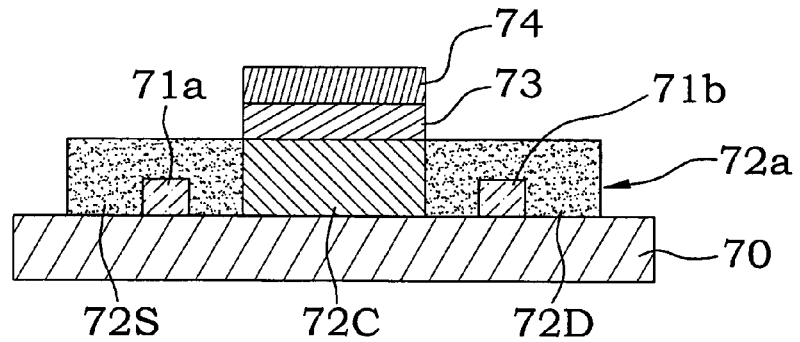

Referring to FIG. 7E, a heat-treatment is performed for electrical activation of the source and drain regions 72S and 72D for five seconds to thirty seconds at a temperature of about 700° C. to 900° C. under a hydrogen atmosphere using a rapid thermal processing annealing (RTA), to thereby complete a thin film transistor.

As described above, since activation is performed at a state where a crystal lattice is equipped in the case that dopants are injected after silicon is crystallized in advance as in the case of the third embodiment of the present invention, a higher temperature activation heat-treatment is needed than those of the activation heat-treatment of the first and second embodiments of the present invention.

In the case of the third embodiment of the present invention, a pair of non-metal seeds 71a and 71b exist on the bottom of the semiconductor layer 72 which is used as an active region in the same manner as that of the first embodiment of the present invention, and an operating region of a thin film transistor (TFT) is limited on the surface of the semiconductor layer 72. Thus, an influence with respect to a silicon-oxide film interface is reduced due to crystallization induced metal at the time of a MILC crystallization. In particular, since silicide is formed before a crystallization heat-treatment is accomplished in the present invention and then the remaining metal is removed, metal pollution in the silicon is removed to thereby enhance the characteristics of a semiconductor device.

Also, the case that an amorphous silicon film is crystallized in advance has a merit that prevents a silicon-oxide film interface characteristic from worsening due to reduction in volume of silicon at the time of crystallizing the amorphous silicon after forming the gate insulation film and the gate electrode.

In the above-described embodiments, crystallization induced metal is deposited on the upper portion of amorphous silicon and then patterned in the form of an island. Thereafter, the island-type crystallization induced metal is made to change to silicide, to thereby form a pair of non-metal seeds. However, it is possible to form a pair of non-metal seeds by depositing amorphous silicon on the upper portion of crystallization induced metal and patterning the deposited amorphous silicon in the form of an island, to then be changed to silicide. In this case, since the remaining crystallization induced metal which is not changed to silicide cannot be removed, a deposition thickness of crystallization induced metal should be properly controlled. However, since the remaining crystallization induced metal exists in the lower portion of amorphous silicon, metal pollution with respect to the surface of the amorphous silicon can be minimized.

In addition, in the above-described embodiments, amorphous silicon and a crystallization induced metal film are patterned in advance and then are made to change to silicide, in order to form a pair of non-metal seeds. However, amorphous silicon and a crystallization induced metal film may be made to change to silicide and then patterned.

As described above, since crystallization seeds are formed with non-metal and crystallized by epitaxial growth in the present invention, there is no metal pollution and it is possible to perform crystallization at a low temperature at which a glass substrate can tolerate. Also, if a particular high-temperature rapid thermal process is executed for electrical activation of a source and drain, a thin film transistor having excellent electrical characteristics can be fabricated without affecting the glass substrate.

Also, according to a poly-crystalline thin film transistor fabrication method using a non-metal seed epitaxial growth (NSEG) technology, there are no problems such as non-uniformity of crystal which may occur at the time of using a laser crystallization method, or inferior surface roughness due to a transition from a liquid phase to a solid phase. Further, the poly-crystalline thin film transistor fabrication method using a non-metal seed epitaxial growth (NSEG) technology does not require for an expansive facility such as laser equipment, to accordingly greatly reduce a production cost.

Also, in the case of a metal induced lateral crystallization (MILC) method which is a poly-crystalline silicon formation technology which does not use laser equipment as in the present invention, metal film is used to thus cause metal pollution to occur. As a result, leakage current increases and electron mobility is reduced, to thereby cause industrial problems. However, in the case of the present invention, metal is not used but non-metal seeds are used. Thus, the above problems do not occur. Thus, a poly-crystalline thin film transistor having high-performance electrical characteristics can be fabricated at a low temperature and at a lower cost than that of the conventional art.

As described above, the preferable embodiments of the present invention have been described with reference to the accompanying drawings. However, the present invention is not limited to the above-described embodiments. It is apparent to one who has an ordinary skill in the art that there may be many modifications and variations within the same technical spirit of the invention.

What is claimed is:

1. A method for crystallizing an amorphous semiconductor thin film, the amorphous semiconductor thin film crystallizing method comprising the steps of:

forming a pair of non-metal seeds for inducing a crystallization of an amorphous semiconductor thin film at a predetermined distance on a transparent insulation substrate;

depositing the amorphous semiconductor thin film on the entire surface of the insulation substrate; and heat-treating the insulation substrate to thereby epitaxially grow a poly-crystalline semiconductor thin film from the non-metal seeds, and to thus crystallize the amorphous semiconductor thin film;

wherein the step of forming the pair of non-metal seeds includes the sub-steps of:

depositing an amorphous silicon thin film on the insulation substrate;

selectively forming a pair of island-type metal patterns at positions corresponding to the pair of non-metal seeds using the crystallization induced metal above the amorphous silicon thin film;

patterning the amorphous silicon thin film using the pair of island-type metal patterns as an etching mask to thereby form a pair of amorphous silicon patterns;

heat-treating the substrate to form a pair of non-metal seeds made of metal silicide; and removing the remaining metal which is not converted into the silicide in the heat-treatment step.

2. The amorphous semiconductor thin film crystallizing method according to claim 1, wherein the crystallization induced metal film is made of at least one selected from the group consisting of Ni, Pd, Ti, Ag, Au, Al, Sn, Sb, Cu, Co, Cr, Mo, Tr, Ru, Rh, Cd, and Pt, with a thickness of 1 Å to 100 Å.

3. The amorphous semiconductor thin film crystallizing method according to claim 1, wherein the heat-treatment for forming the metal silicide is accomplished for 30 minutes to two hours at a temperature of 400° C. to 500° C.

4. The amorphous semiconductor thin film crystallizing method according to claim 1, wherein the pair of island-type metal patterns is formed by a lift-off method using a photosensitive film, or a selective deposition method using a hard mask.

5. The amorphous semiconductor thin film crystallizing method according to claim 1, wherein the crystallization heat-treatment is executed before or after impurities are ion-injected.

6. The amorphous semiconductor thin film crystallizing method according to claim 1, prior to the heat-treatment step for crystallizing the amorphous semiconductor thin film at the time of crystallizing the amorphous semiconductor thin film, further comprising the steps of:

patterning the poly-crystalline semiconductor thin film to thereby form a semiconductor layer which is used as an active region;

sequentially forming an insulation film and a conductive metal film on the semiconductor layer;

sequentially patterning the insulation film and the conductive metal film to thereby form a gate electrode and a gate insulation film;

selectively ion-injecting impurities using the gate electrode as a mask to thereby define a source region and a drain region;

forming an off-set formation photosensitive film pattern surrounding the gate electrode and the gate insulation film; and depositing the crystallization induced metal patterns on the entire surface of the substrate, and then removing the photosensitive film pattern by a lift-off method, to thereby locally cover only some portions of the source region and the drain region with the pair of crystallization induced metal pattern isolated by an off-set distance from the gate insulation film.

7. The amorphous semiconductor thin film crystallizing method according to claim 1, wherein the crystallization heat-treatment is executed at 400° C. to 600° C. under a hydrogen atmosphere.

8. A method for crystallizing an amorphous semiconductor thin film, the amorphous semiconductor thin film crystallizing method comprising the steps of:

forming a pair of non-metal seeds for inducing a crystallization of an amorphous semiconductor thin film at a predetermined distance on a transparent insulation substrate;

depositing the amorphous semiconductor thin film on the entire surface of the insulation substrate; and heat-treating the insulation substrate to thereby epitaxially grow a poly-crystalline semiconductor thin film from the non-metal seeds, and to thus crystallize the amorphous semiconductor thin film;

wherein the step of forming the pair of non-metal seeds includes the sub-steps of:

depositing an amorphous silicon thin film on the insulation substrate;

depositing a crystallization induced metal film above the amorphous silicon thin film;

sequentially patterning the crystallization induced metal film and the amorphous silicon thin film by photolithography using a photosensitive agent, to thereby form a pair of island-type meal patterns and amorphous silicon patterns;

heat-treating the substrate to form a pair of non-metal seeds made of metal silicide; and removing the remaining metal which is not converted into the silicide in the heat-treatment step.

9. A method for crystallizing an amorphous semiconductor thin film, the amorphous semiconductor thin film crystallizing method comprising the steps of:

forming a pair of non-metal seeds for inducing a crystallization of an amorphous semiconductor thin film at a predetermined distance on a transparent insulation substrate;

depositing the amorphous semiconductor thin film on the entire surface of the insulation substrate; and heat-treating the insulation substrate to thereby epitaxially grow a poly-crystalline semiconductor thin film from the non-metal seeds, and to thus crystallize the amorphous semiconductor thin film;

wherein the step of forming the pair of non-metal seeds includes the sub-steps of:

depositing a crystallization induced metal film on the insulation substrate;

depositing the amorphous silicon thin film above the crystallization induced metal film;

sequentially patterning the crystallization induced metal film and the amorphous silicon thin film by photolithography using a photosensitive agent, to thereby form a pair of island-type meal patterns and amorphous silicon patterns; and heat-treating the substrate to form a pair of non-metal seeds made of metal silicide.

10. A thin film transistor manufacturing method comprising the steps of:

forming a pair of non-metal seeds for inducing a crystallization of an amorphous semiconductor thin film at a predetermined distance on a transparent insulation substrate;

depositing and patterning the amorphous semiconductor thin film on the entire surface of the insulation substrate, to thereby form a semiconductor layer;

sequentially depositing and patterning an insulation film and a metal film on the substrate to thereby form a gate electrode and a gate insulation film;

ion-injecting dopants using the gate electrode as a mask to thereby define a source region and a drain region; and heat-treating the insulation substrate to thereby epitaxially grow a poly-crystalline semiconductor thin film from the non-metal seeds, and to thus crystallize the amorphous semiconductor thin film;

wherein the step of forming the pair of non-metal seeds includes the sub-steps of:

depositing an amorphous silicon thin film on the insulation substrate;

selectively forming a pair of island-type metal patterns at positions corresponding to the pair of non-metal seeds using the crystallization induced metal above the amorphous silicon thin film;

patterning the amorphous silicon thin film using the pair of island-type metal patterns as an etching mask to thereby form a pair of amorphous silicon patterns;

heat-treating the substrate to form a pair of non-metal seeds made of metal silicide; and removing the remaining metal which is not converted into the silicide in the heat-treatment step.

11. The thin film transistor manufacturing method according to claim 10, wherein the crystallization induced metal film is made of at least one selected from the group consisting of Ni, Pd, Ti, Ag, Au, Al, Sn, Sb, Cu, Co, Cr, Mo, Tr, Ru, Rh, Cd, and Pt, with a thickness of 1 Å to 100 Å.

12. The thin film transistor manufacturing method according to claim 10, wherein the heat-treatment for forming the metal silicide is accomplished for 30 minutes to two hours at a temperature of 400° C. to 500° C.

13. The thin film transistor manufacturing method according to claim 10, prior to the heat-treatment step for crystallizing the amorphous semiconductor thin film, further comprising the steps of:

forming an off-set formation photosensitive film pattern surrounding the gate electrode and the gate insulation film; and depositing the crystallization induced metal patterns on the entire surface of the substrate, and then removing the photosensitive film pattern by a lift-off method, to thereby locally cover only some portions of the source region and the drain region with the pair of crystallization induced metal pattern isolated by an off-set distance from the gate insulation film.

14. The thin film transistor manufacturing method according to claim 13, wherein the ion-injected dopants are N-type impurities.

15. The thin film transistor manufacturing method according to claim 10, wherein a post heat-treatment for electrical activation of the dopants injected into the source region and the drain region is executed at any step after ion-injection.

16. The thin film transistor manufacturing method according to claim 15, wherein a post heat-treatment for electrical activation of the dopant injected into the source region and the drain region is executed for five to thirty seconds at a temperature range of 700° C. to 900° C. in a rapid thermal annealing (RTA).

17. A thin film transistor manufacturing method comprising the steps of:

forming a pair of non-metal seeds for inducing a crystallization of an amorphous semiconductor thin film at a predetermined distance on a transparent insulation substrate;

depositing and patterning the amorphous semiconductor thin film on the entire surface of the insulation substrate, to thereby form a semiconductor layer;

sequentially depositing and patterning an insulation film and a metal film on the substrate to thereby form a gate electrode and a gate insulation film;

ion-injecting dopants using the gate electrode as a mask to thereby define a source region and a drain region; and heat-treating the insulation substrate to thereby epitaxially grow a poly-crystalline semiconductor thin film from the non-metal seeds, and to thus crystallize the amorphous semiconductor thin film;

wherein the step of forming the pair of non-metal seeds includes the sub-steps of:

depositing an amorphous silicon thin film on the insulation substrate;

depositing a crystallization induced metal film above the amorphous silicon thin film;

sequentially patterning the crystallization induced metal film and the amorphous silicon thin film by photolithography using a photosensitive agent, to thereby form a pair of island-type meal patterns and amorphous silicon patterns;

heat-treating the substrate to form a pair of non-metal seeds made of metal silicide; and removing the remaining metal which is not converted into the silicide in the heat-treatment step.

18. A thin film transistor manufacturing method comprising the steps of:

forming a pair of non-metal seeds for inducing a crystallization of an amorphous semiconductor thin film at a predetermined distance on a transparent insulation substrate;

depositing and patterning the amorphous semiconductor thin film on the entire surface of the insulation substrate, to thereby form a semiconductor layer;

sequentially depositing and patterning an insulation film and a metal film on the substrate to thereby form a gate electrode and a gate insulation film;

ion-injecting dopants using the gate electrode as a mask to thereby define a source region and a drain region; and heat-treating the insulation substrate to thereby epitaxially grow a poly-crystalline semiconductor thin film from the non-metal seeds, and to thus crystallize the amorphous semiconductor thin film;

wherein the step of forming the pair of non-metal seeds includes the sub-steps of:

depositing a crystallization induced metal film on the insulation substrate;

depositing the amorphous silicon thin film above the crystallization induced metal film;

sequentially patterning the crystallization induced metal film and the amorphous silicon thin film by photolithography using a photosensitive agent, to thereby form a pair of island-type meal patterns and amorphous silicon patterns; and heat-treating the substrate to form a pair of non-metal seeds made of metal silicide.

19. A thin film transistor manufacturing method comprising the steps of:

forming a pair of non-metal seeds for inducing a crystallization of an amorphous semiconductor thin film at a predetermined distance on a transparent insulation substrate;

depositing and patterning the amorphous semiconductor thin film on the entire surface of the insulation substrate, to thereby form a semiconductor layer;

heat-treating the insulation substrate to thereby epitaxially grow a poly-crystalline semiconductor thin film from the non-metal seeds, and to thus crystallize the amorphous semiconductor thin film;

sequentially depositing and patterning an insulation film and a metal film on the substrate to thereby form a gate electrode and a gate insulation film; and ion-injecting dopants using the gate electrode as a mask to thereby define a source region and a drain region;

wherein the step of forming the pair of non-metal seeds includes the sub-steps of:

depositing an amorphous silicon thin film on the insulation substrate;

selectively forming a pair of island-type metal patterns at positions corresponding to the pair of non-metal seeds using the crystallization induced metal above the amorphous silicon thin film;

patterning the amorphous silicon thin film using the pair of island-type metal patterns as an etching mask to thereby form a pair of amorphous silicon patterns;

heat-treating the substrate to form a pair of non-metal seeds made of metal silicide; and removing the remaining metal which is not converted into the silicide in the heat-treatment step.

* * * * *